(12) United States Patent
Van Schoot et al.

(10) Patent No.: US 9,860,966 B2
(45) Date of Patent: Jan. 2, 2018

(54) RADIATION SOURCE

(71) Applicant: ASML Netherlands B.V., Veldhoven (NL)

(72) Inventors: Jan Bernard Plechelmus Van Schoot, Eindhoven (NL); Antonius Theodorus Wilhelmus Kempen, Den Bosch (NL); Hermanus Kreuwel, Veldhoven (NL); Andrei Mikhailovich Yakunin, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 98 days.

(21) Appl. No.: 14/400,773

(22) PCT Filed: Apr. 29, 2013

(86) PCT No.: PCT/EP2013/058869
§ 371 (c)(1),
(2) Date: Nov. 12, 2014

(87) PCT Pub. No.: WO2013/174620
PCT Pub. Date: Nov. 28, 2013

(65) Prior Publication Data
US 2015/0146182 A1    May 28, 2015

Related U.S. Application Data

(60) Provisional application No. 61/649,895, filed on May 21, 2012.

(51) Int. Cl.
*G03B 27/54* (2006.01)
*H05G 2/00* (2006.01)
*G03F 7/20* (2006.01)

(52) U.S. Cl.
CPC ......... *H05G 2/008* (2013.01); *G03F 7/70033* (2013.01); *H05G 2/006* (2013.01); *H05G 2/005* (2013.01)

(58) Field of Classification Search
CPC .... G03F 7/70033; H05G 2/005; H05G 2/006; H05G 2/008; H04N 21/44209; H04N 21/4432; H04N 21/4436
See application file for complete search history.

(56) References Cited

U.S. PATENT DOCUMENTS 5,226,948 A * 7/1993 Orme ................... B22F 9/08
                                                      164/46
6,647,088 B1   11/2003 Schmidt et al.
(Continued)

FOREIGN PATENT DOCUMENTS

CN       1379968     11/2002
CN      101978792    2/2011
(Continued)

OTHER PUBLICATIONS

International Search Report and Written Opinion dated Aug. 2, 2013 for corresponding International Patent Application No. PCT/EP2013/058869 (7 pages).

(Continued)

*Primary Examiner* — Deoram Persaud
(74) *Attorney, Agent, or Firm* — Pillsbury Winthrop Shaw Pittman LLP

(57) ABSTRACT

A radiation source for generating EUV radiation includes a laser configured to fire laser pulses at a target area to which is supplied a stream of fuel droplets, which may be tin droplets that emit EUV radiation when excited by the laser beam. The EUV radiation is collected by a collector. The tin droplets may be pre-conditioned by a laser pre-pulse before the main laser pulse to change the shape of the droplets so that the droplets are in an optimum condition for receiving (Continued)

the main laser pulse. Embodiments of the invention take into account the effect of the vaporization of one fuel droplet on succeeding droplets and allow the timing of the main and/or pre-pulse to be adjusted to take into account any delay in arrival of the subsequent droplet or oscillations in the shape of the subsequent droplet which may be caused by vaporization of the preceding droplet.

18 Claims, 4 Drawing Sheets

(56) References Cited

U.S. PATENT DOCUMENTS

| | | | |
|---|---|---|---|
| 6,855,943 B2 | 2/2005 | Shields | |
| 7,872,245 B2 | 1/2011 | Vaschenko et al. | |
| 7,928,416 B2 | 4/2011 | Fomenkov | |
| 8,502,178 B2* | 8/2013 | Moriya | H05G 2/003 250/504 R |
| 8,653,437 B2* | 2/2014 | Partlo | H05G 2/008 250/205 |
| 8,872,123 B2* | 10/2014 | Crouch | H05G 2/003 250/372 |
| 8,895,946 B2* | 11/2014 | Ceglio | G21K 1/067 250/504 R |
| 9,131,589 B2* | 9/2015 | Hayashi | H05G 2/008 |
| 2003/0183603 A1* | 10/2003 | Forsman | B23K 26/0613 219/121.6 |
| 2003/0194055 A1* | 10/2003 | Mochizuki | G21B 1/23 378/119 |
| 2005/0258768 A1 | 11/2005 | Gaebel et al. | |
| 2006/0017026 A1* | 1/2006 | Hergenhan | H05G 2/003 250/504 R |
| 2006/0140227 A1* | 6/2006 | Rocca | H01S 4/00 372/5 |
| 2008/0149862 A1 | 6/2008 | Fomenkov | |
| 2009/0014668 A1* | 1/2009 | Vaschenko | B82Y 10/00 250/504 R |
| 2010/0294953 A1 | 11/2010 | Vaschenko et al. | |
| 2011/0101863 A1* | 5/2011 | Komori | G03F 7/70033 315/111.41 |
| 2012/0200857 A1* | 8/2012 | Sharpe | G01N 15/1404 356/436 |
| 2012/0305811 A1* | 12/2012 | Wakabayashi | H05G 2/003 250/504 R |
| 2012/0307851 A1* | 12/2012 | Hori | H01S 3/104 372/27 |
| 2013/0077073 A1* | 3/2013 | Van Schoot | G03F 7/70558 355/67 |
| 2014/0098830 A1* | 4/2014 | Yabu | H05G 2/005 372/30 |

FOREIGN PATENT DOCUMENTS

| | | |
|---|---|---|
| EP | 1 367 866 | 12/2003 |
| JP | 2004-31342 | 1/2004 |
| JP | J2006-244837 | 9/2006 |
| JP | 2010-514214 | 4/2010 |
| JP | 2011-181935 | 9/2011 |
| WO | WO 2011/082891 | 7/2011 |

OTHER PUBLICATIONS

Chinese Office Action dated Mar. 29, 2016 for corresponding Chinese Patent Application No. 2013826022.9 (13 pages).
Japanese Office Action dated Jan. 31, 2017 for corresponding Japanese Patent Application No. 2015-513072 (7 pages).

* cited by examiner

RADIATION SOURCE

CROSS-REFERENCE TO RELATED APPLICATIONS

This application is the U.S. national phase entry of International Patent Application No. PCT/EP2013/058869, filed Apr. 29, 2013, which claims the benefit of U.S. provisional application 61/649,895, which was filed on May 21, 2012, and which is incorporated herein in its entirety by reference.

FIELD

The present invention relates to a radiation source, and in particular to a EUV radiation source suitable for use in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \qquad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, or for example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material such as tin. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

SUMMARY

According to an aspect of the invention, there is provided a method of generating EUV radiation in a radiation source for a lithographic apparatus. The method comprises supplying a stream of fuel droplets to a target area, configuring a laser to emit pulses of laser radiation directed at said target area timed to strike and vaporize a fuel droplet to generate EUV radiation, controlling the timing of said pulses to be dependent on the effect of the vaporization of one fuel droplet on a subsequent fuel droplet in said stream.

In an embodiment of the invention, the timing of said pulses is adjusted in response to a predicted delay in arrival of a fuel droplet consequent upon the vaporization of a preceding fuel droplet. The predicted delay may be calculated based on the magnitude of the EUV energy emitted by the vaporization of the preceding fuel droplet, as the delay will be proportional to the number of ions emitted and the number of ions emitted will be proportional to the emitted EUV energy.

In an embodiment of the invention, a laser pre-pulse is directed at the fuel droplets before the fuel droplets reach the target area, and the timing of the pre-pulse is controlled to be dependent on the effect of the vaporization of one fuel droplet on a subsequent fuel droplet in the stream.

The pre-pulse serves to pre-condition a fuel droplet prior to the droplet being vaporized and desirably the timing of the pre-pulse is controlled to optimize the pre-conditioning of the fuel droplet. Desirably, the pre-conditioning comprises shaping the fuel droplet and in an embodiment of the invention, the timing of the pre-pulse is chosen based on oscillations in the shape of the fuel droplet caused by the vaporization of a preceding fuel droplet. In particular, the pre-pulse may be timed to be coincident with a point in the oscillation of the fuel droplet where the fuel droplet has its original shape. In an embodiment of the invention, the pre-pulse may be omitted and a subsequent fuel droplet may be caused to oscillate in shape by the vaporization of a preceding fuel droplet with a main laser pulse being timed to coincide with an optimum shape of the subsequent fuel droplet.

According to an aspect of the present invention, there is provided a radiation source for generating EUV radiation. The radiation source includes means for supplying a stream of fuel droplets to a target area, a laser configured to emit pulses of laser radiation to the target area to vaporize a fuel droplet to generate EUV radiation, and control means for controlling the laser to be dependent on the effects of the vaporization of one fuel droplet on a subsequent fuel droplet in the stream.

According to an aspect of the present invention, there is provided a radiation source for generating EUV radiation. The radiation source comprises a fuel supply configured to supply a stream of fuel droplets to a target area; a laser configured to emit pulses of laser radiation to said target area to vaporize a fuel droplet to generate EUV radiation; and a controller configured to control the laser to be dependent on the effects of the vaporization of one fuel droplet on a subsequent fuel droplet in said stream.

Aspects of the invention also extend to a lithographic apparatus incorporating a radiation source.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
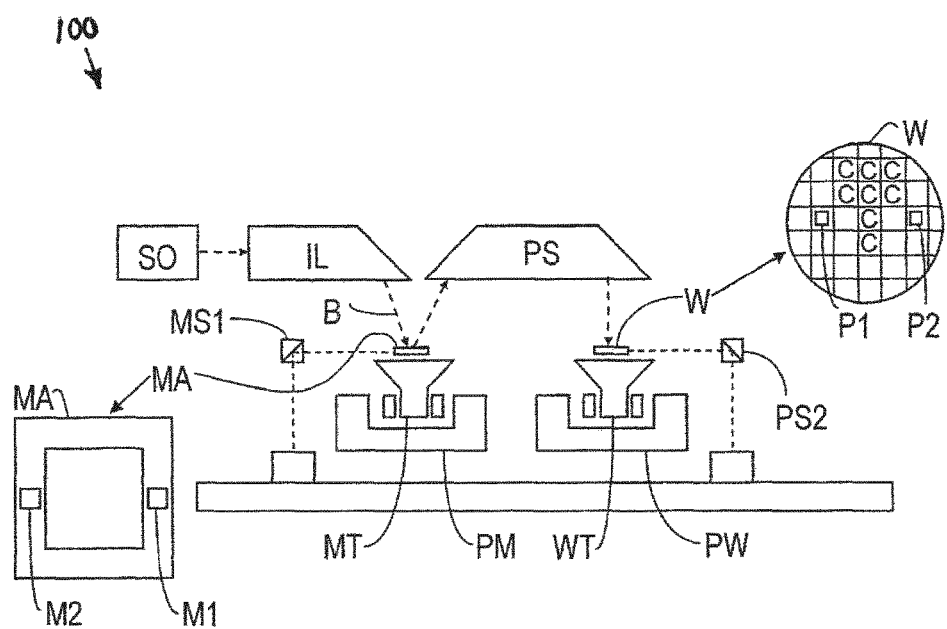
FIG. 1 schematically depicts a lithographic apparatus according to an embodiment of the invention.

FIG. 1 schematically depicts a lithographic apparatus 100 according to an embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps. Some gas may be provided in some parts of the lithographic apparatus, for example to allow gas flow to be used to reduce the likelihood of contamination reaching optical components of the lithographic apparatus.

As here depicted, the apparatus is of a reflective type (e.g. employing a reflective mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

Referring to FIG. 1, the illuminator IL receives an extreme ultra violet (EUV) radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP"), the desired plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g. EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases, the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g. mask) MA, which is held on the support structure (e.g. mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
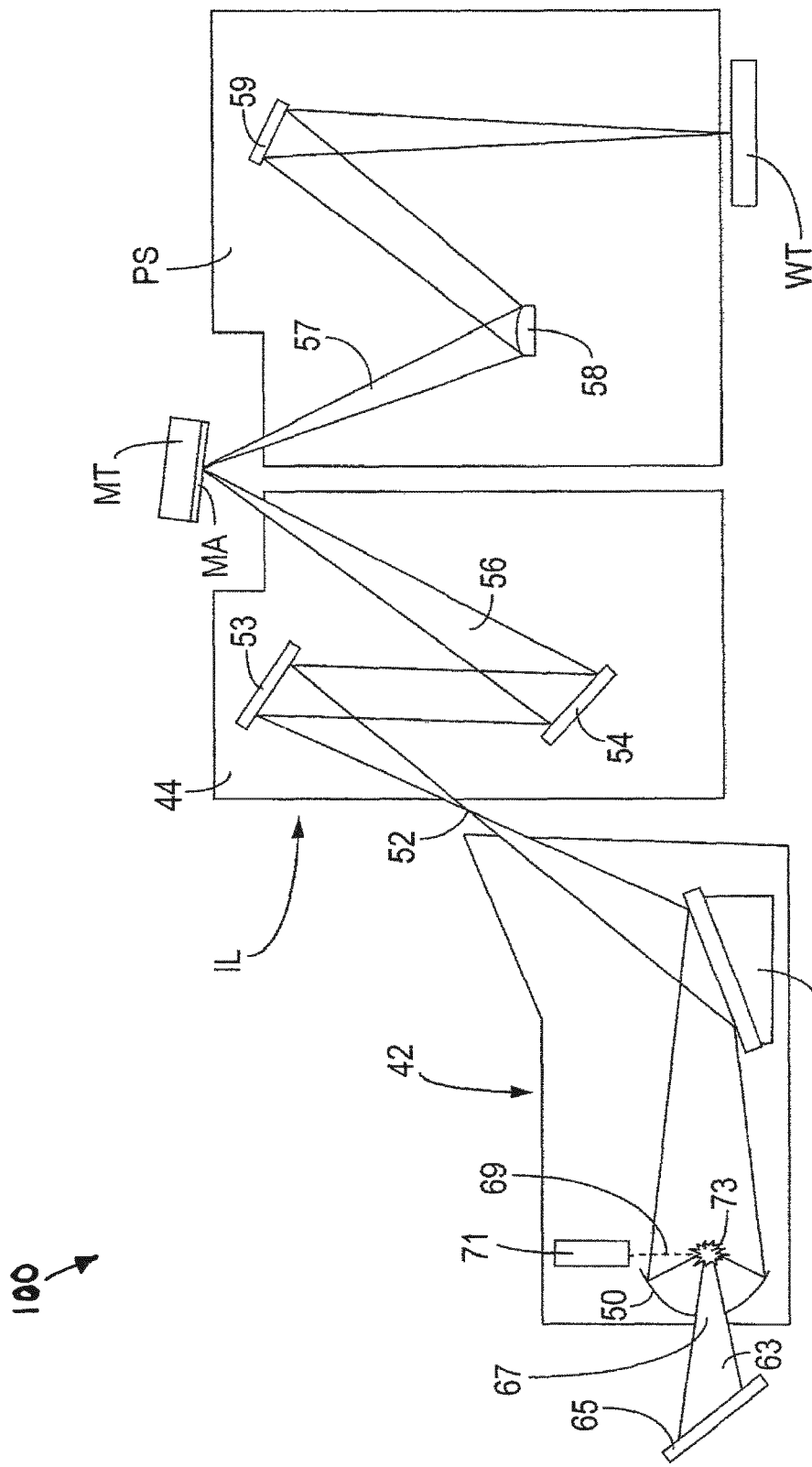
FIG. 2 schematically depicts the optical path of a beam through a lithographic apparatus.

FIG. 2 shows the lithographic apparatus 100 in more detail and in particular shows the source collector module SO in more detail including a radiation system 42, the illumination system IL and projection system PS. EUV radiation may be produced by creating a plasma which is very hot and which emits radiation in the EUV range of the electromagnetic spectrum. The plasma may be created by laser irradiation of a droplet of target material provided by a target material supply 71. Droplets of target material may for example be Xe, Li or Sn and may be ejected along a trajectory 69 by the target material supply. The droplets of target material may for example have a diameter of about 20-50 μm, and may for example have a velocity of about 50-100 m/s.

Radiation emitted by the plasma is reflected by a collector mirror 50 which is configured to focus the radiation to a focal point which in this embodiment coincides with an intermediate focus 52. In this embodiment, the radiation is focused to the focal point via grazing incidence mirror 51, though in other embodiments this may be omitted.

From the radiation system 42, a beam of radiation 56 is reflected in the illumination system IL via mirrors 53,54 onto a patterning device MA (eg a reticle or mask) positioned on patterning device support MT (eg a reticle or mask table). The patterned beam 57 is then imaged in projection system PS via reflective elements 58,59 onto the substrate W.

The grazing incidence mirror 51 may be a grating spectral filter. Instead of or in addition to the grating spectral filter, a transmissive optical filter may be present in the lithographic apparatus that is transmissive for EUV and less transmissive of radiation at other wavelengths (or even substantially absorbing of radiation at other wavelengths).

The collector mirror 50 may be a normal-incidence mirror, as shown in FIG. 2, or may have some other form. The collector mirror 50 may comprise Si/Mo multi-layers.

The radiation system 42 is provided with a laser system (described further below) which is constructed and arranged to provide a laser radiation beam 63 that is reflected by a steering mirror 65 through an opening 67 provided in the collector mirror 50. The laser system may be a pulsed laser system. The steering mirror 65 is arranged to direct a beam path of the laser radiation beam 63 through the plasma formation position 73.

In operation, droplets of target material are supplied along the trajectory 69 by the target material supply 71. When a droplet of target material reaches the plasma formation position 73, the laser radiation beam 63 impinges on the droplet and an EUV radiation-emitting plasma is formed. EUV radiation emitted from the plasma is focused by the normal-incidence collector mirror 50 and passes via the reflective spectral grating filter 51 to the intermediate focus point 52.

To achieve optimum efficiency it is desirable to condition the target material, e.g. a tin droplet, prior to being struck by a main laser pulse (for exciting the fuel to provide the EUV emitting plasma) and in particular it is known to apply a preliminary laser pulse—known as a pre-pulse—prior to the main pulse. The pre-pulse is of a lower power than the main pulse and functions to shape the tin droplet—in particular to flatten the droplet into a disk with the disk being oriented such that the main laser pulse strikes the face of the disk. Such an orientation is known to improve the efficiency of the EUV generation process. The pre-pulse may be applied by a second laser or the main laser may be configured to emit the pre-pulse using a beam splitter such that the pre-pulse is targeted on the correct spot, which will be a location before the tin droplet reaches the target area (the aforementioned plasma formation position 73).

In order to maximize the efficiency of the apparatus, the performance of the source collector module SO should be optimized, and one aspect of that performance is the relationship between the laser pulses and the supply of tin droplets.

In particular, there are a number of factors that should be taken into account if optimum performance of the source collector module SO is to be obtained. These include ensuring that the laser is fired at exactly the right time to ensure that the main pulse arrives at the target area at exactly the same time as the tin droplet. To achieve this information, the trajectory of each individual droplet is measured (for example by using a camera and image capture and analysis software) and is used to control the timing of the laser. If a droplet is predicted to arrive late then the firing of the laser may be delayed.

A potential problem is that the ignition of one tin droplet may have an effect on subsequent tin droplets. When a tin droplet is hit by the main laser pulse, a plasma is generated, which emits the desired EUV radiation. However, the plasma also emits an ion shock wave that may interfere with the next droplet. In particular, the shock wave may deform the droplet, thereby interfering with the process of conditioning the shape of the droplet. The ion shock wave may also slow down the next droplet and thus delay the arrival of the droplet at the target location. Although the trajectory of the droplet may be measured, normally this measurement is carried out when the tin droplet is still some distance (of the order of a few millimeters) from the target location and the effect of any disturbances that occur after that measurement—such as may be created by the ion shock wave—will not be taken into account.

It is therefore desirable to consider the effects of the ion shock wave on the next droplet and the relationship between the presence of that pulse and the optimum timing of the pulses (both pre-pulse and main pulse). In particular, it is desirable to consider the delay to the next droplet caused by the ignition of one droplet, and also consider the effect that that ignition has on the shape of the next droplet.

Figure 3:
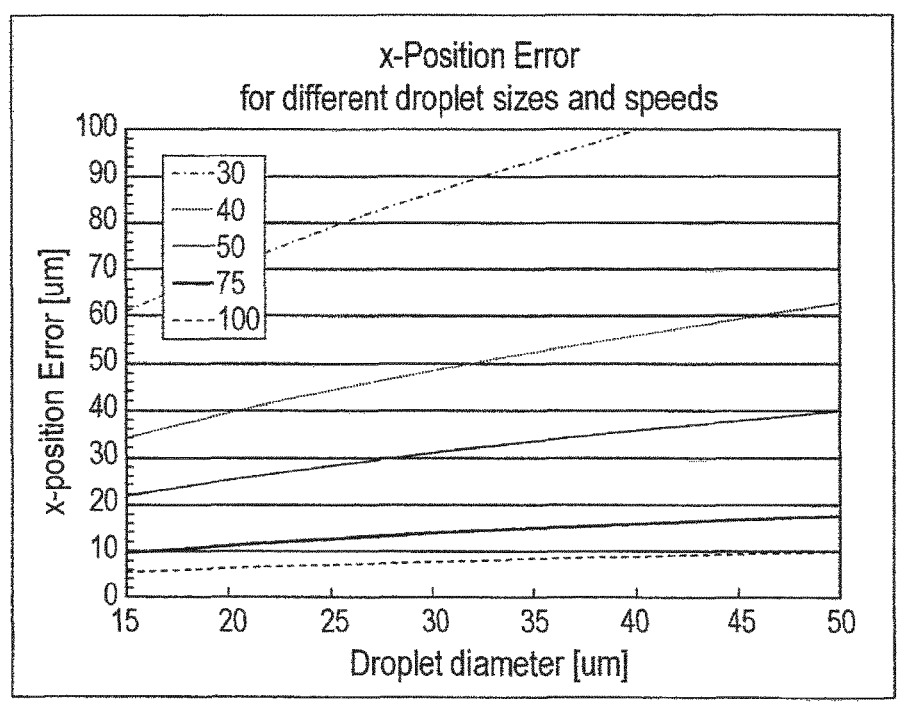
FIG. 3 is a plot showing position error in the x-direction as a function of ion wind for various droplet sizes and speeds.

Considering firstly the question of delay, FIG. 3 is a plot showing the estimated position error in the x direction (the direction of movement of the tin droplets) for a range of droplet sizes and speeds (five different speeds illustrated by different broken lines—30 m/s, 40 m/s, 50 m/s, 75 m/s and 100 m/s) where the laser is a 40 kW $CO_2$ laser driven at a frequency of 80 kHz and an energy per pulse of 0.5 J. With an efficiency of 3%, this yields a 250 W EUV source. For a situation with droplets of 30 μm diameter and a high speed of 100 m/s the error in the x-direction caused by the ion shock wave will be 8 μm. For lower speeds—which in practice is more likely to be the case—the error will be even greater. To complicate matters further, each laser pulse will not be identical and realistic dose control values are about plus or minus 30%.

The extent of the delay on the next droplet will depend on the number of ions emitted by the previous ignition and in turn this number is proportional to the amount of emitted EUV. Firstly, the number of ions and the energy spectrum of the emitted ions in the direction of the next approaching droplet is measured or simulated. From this, the impulse of the fraction of the ions hitting the next droplet can be calculated, and assuming an inelastic collision with all energy transferred to the next arriving droplet, the new speed of that next arriving droplet can be calculated. Thus by measuring the emitted EUV energy from one droplet ignition, the delay on the next droplet can be estimated, as that delay will be proportional to the emitted EUV energy. EUV energy may be measured by an energy sensor provided in the radiation system 42. Such an energy sensor is often provided as part of the radiation system 42 for feedback and control purposes in any event, but alternatively a dedicated energy sensor may be provided for this purpose. Any form of fast response sensor can be used. Data from the energy sensor relating to the emitted EUV energy will be fed back to a laser control means (e.g., a controller), which will include processing means (e.g. a processor) adapted to calculate an estimated delay to the next fuel droplet based on the emitted EUV energy on the basis that the number of ions emitted with be directly proportional to the measured energy and that the additional delay on the droplet will be proportional also to the number of ions and thus the emitted EUV energy. The laser control means will thus adjust the timing of the laser—both in respect of the pre-pulse and the main pulse—dependent on the data input from the energy sensor. Typically, the timing of both the pre-pulse and the main pulse will both be delayed by the same amount and the time interval between the pre-pulse and the main pulse will be substantially unchanged.

One of the functions of the pre-pulse laser irradiation is to pre-condition the fuel droplet into an optimum condition for irradiation by the main laser pulse. In particular, it is known that the conversion efficiency (i.e. the efficiency of the generation of EUV radiation from a given laser pulse energy) is higher if the fuel droplet is formed into a disk or pancake shape oriented such that the disk faces the laser pulse. This shape can be created by striking the droplet with a laser pre-pulse that is of lower energy than the power of the main pulse. Typically the energy of the pre-conditioning pulse may be in the range of from 1 mJ to 1000 mJ with an interaction time with the fuel droplet of 0.1 ns to 100 ns.

Figure 4:
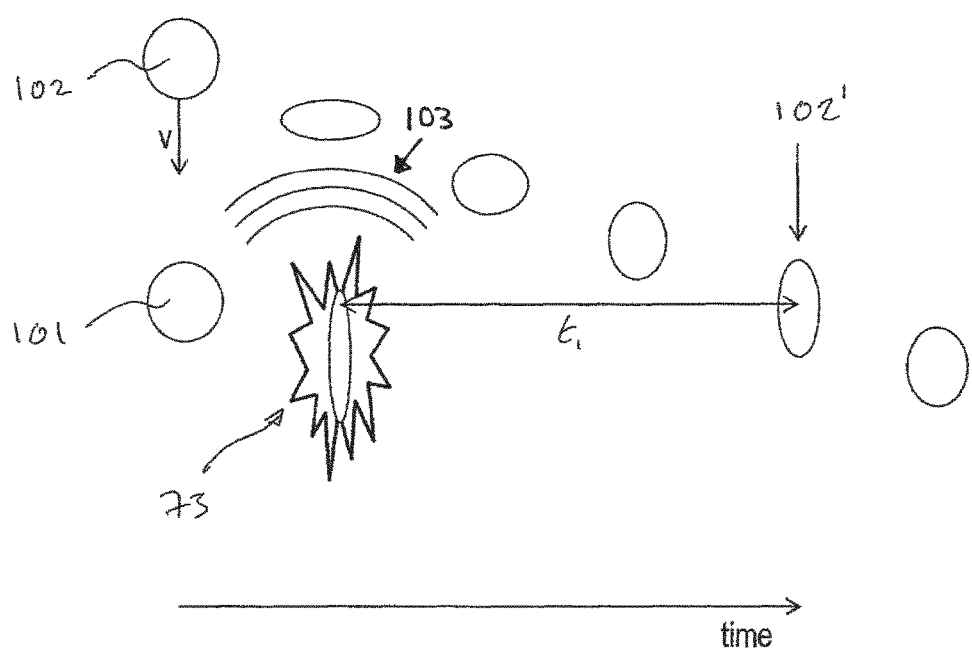
FIG. 4 schematically depicts the effects of the shock wave on a subsequent droplet.

A potential problem may exist, which is that the shock wave from the vaporization of the previous droplet by the previous main pulse may interfere with the shape of the next droplet. In particular, when the shock wave strikes the droplet it will cause the droplet to oscillate as is shown in FIG. 4. FIG. 4 shows two successive droplets 101,102 moving towards the target area 73 with speed v. When the first droplet 101 is vaporized, a shock wave illustrated at 103 is directed back towards the second droplet. It will be understood of course that the shock wave will extend in all directions but only that part of the shock wave that is directed towards the next droplet 102 is of relevance here. The shock wave will cause droplet 102 to oscillate in shape between its normal spherical condition and disk-like shapes.

This oscillation of the shape of the next droplet 102 should be taken into account when considering the timing of the next pre-pulse. The next pre-pulse can be timed to coincide with a point in the oscillation cycle where the droplet 102 has returned to its original spherical condition, or indeed when the droplet 102 is already partly in a desired disk-like shape as illustrated at 102' which comes after a time interval $t_1$ from the vaporization of droplet 101.

Oscillations of a constrained liquid droplet are described by the equation:

$$\omega_n^2 = \frac{n(n-1)(n+1)(n+2)}{(n+1)\rho_i + n\rho_e} \frac{\sigma}{R^3} \quad (2)$$

Where ω is the eigen frequency, n is the order of the eigen-frequency, σ is the surface tension, and $\rho_1$ and $\rho_e$ are the densities of the liquid (e.g. Sn) and the medium in which the droplet is immersed (which in this case is a vacuum and hence zero), R is the radius of the droplet. For a 30 μm diameter Sn spherical droplet in a vacuum, this leads to a lowest eigen-frequency ($f_{n=1}$) of 69 kHz or a period t of 14.5 μs.

The optimum time for applying the pre-pulse will come when the droplet has returned to its normal state, which will first happen after a time interval that is one half of the oscillatory period or subsequent moments in the oscillatory cycle of the droplet which may be defined as (m+½)t where m=0, 1, 2, 3, . . . measured from when the previous droplet is vaporized.

Alternatively, it may be possible to apply the pre-pulse when the droplet is at the most stable points in its oscillatory period which will occur at the top and bottom of the sine curve, i.e. at ¼ and ¾ of the period t.

Generally, the correct timing of the next pre-pulse following vaporization of a preceding droplet may depend on a number of factors, including in addition to the oscillation of the shape of the next droplet as discussed above, also the frequency of the droplet source and the speed of the droplets.

Another option is that the pre-pulse may be omitted altogether if the shock wave itself is used to pre-condition the fuel droplet. In particular, the oscillations caused by the shockwave will result in the droplet at some points in the cycle having the desired disk or pancake like shape and the main pulse may be timed to coincide with this condition. In such a case, the pre-pulse laser may be omitted, which may lead to reduced power consumption, and less complexity for the laser system and associated optical system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled person will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Additionally, it is mentioned that the present invention is not only suitable to be used as a source in a lithographic apparatus, but, alternatively, as a radiation source for other systems that may require EUV radiation, such as an extreme ultraviolet reticle inspection system, a mask blank inspection system or an aerial image measurements and defects review system.

The term "lens", where the context allows, may refer to any one or combination of various types of optical components, including refractive, reflective, magnetic, electromagnetic and electrostatic optical components.

The term "EUV radiation" may be considered to encompass electromagnetic radiation having a wavelength within the range of 5-20 nm, for example within the range of 13-14 nm, or example within the range of 5-10 nm such as 6.7 nm or 6.8 nm.

While specific embodiments of the invention have been described above, it will be appreciated that the invention may be practised otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

What is claimed is:

1. A method of generating EUV radiation in a radiation source for a lithographic apparatus, the method comprising:
    supplying a stream of fuel droplets to a target area;
    configuring a laser to emit pulses of laser radiation directed at said target area timed to strike and vaporize a fuel droplet to generate EUV radiation; and
    predicting a delay caused by the effect of vaporization of one fuel droplet on a subsequent fuel droplet in said stream; and
    controlling the timing of said pulses to be dependent on the predicted delay caused by the effect of the vaporization.

2. A method as claimed in claim 1, wherein the predicted delay is calculated based on the magnitude of the EUV energy emitted by the vaporization of said preceding fuel droplet.

3. A method as claimed in claim 2, wherein the delay is calculated as being proportional to the magnitude of the emitted EUV energy.

4. A method as claimed in claim 1, wherein a laser pre-pulse is directed at said fuel droplets before the fuel droplets reach said target area, and wherein the timing of said pre-pulse is controlled to be dependent on the effect of the vaporization of one fuel droplet on a subsequent fuel droplet in said stream.

5. A method as claimed in claim 4, wherein said pre-pulse serves to pre-condition a fuel droplet prior to said droplet being vaporized, and wherein the timing of said pre-pulse is controlled to optimize the pre-conditioning of said fuel droplet.

6. A method as claimed in claim 5, wherein said pre-conditioning comprises shaping said fuel droplet, and wherein the timing of said pre-pulse is chosen based on oscillations in the shape of said fuel droplet caused by the vaporization of a preceding fuel droplet.

7. A method as claimed in claim 6, wherein the pre-pulse is timed to be coincident with a point in the oscillation of the fuel droplet where the fuel droplet has its original shape.

8. A method as claimed in claim 1, wherein a subsequent fuel droplet is caused to oscillate in shape by the vaporization of a preceding fuel droplet, and the laser pulse is timed to coincide with an optimum shape of said subsequent fuel droplet.

9. A radiation source for generating EUV radiation, said radiation source comprising:
    a fuel droplet source, configured and arranged to supply a stream of fuel droplets to a target area;
    a laser configured to emit pulses of laser radiation to said target area to vaporize a fuel droplet to generate EUV radiation; and
    a controller, configured and arranged to predict a delay caused by the effect of vaporization of one fuel droplet on a subsequent fuel droplet in said stream, and to control the laser to be dependent on the predicted delay caused by the effects of the vaporization of one fuel droplet on a subsequent fuel droplet in said stream.

10. A radiation source as claimed in claim 9, wherein said controller is adapted to adjust the timing of said pulses in response to a predicted delay in arrival of a fuel droplet consequent upon the vaporization of a preceding fuel droplet.

11. A radiation source as claimed in claim 10, further comprising an energy sensor configured and arranged to determine the magnitude of the EUV energy emitted by the vaporization of a fuel droplet, and wherein said controller is adapted to calculate a predicted delay in arrival of a fuel droplet consequent upon the vaporization of a preceding fuel droplet.

12. A radiation source as claimed in claim 9, further a preconditioning system, configured and arranged to direct a laser pre-pulse at said fuel droplets before the fuel droplets reach said target area, and wherein said controller is adapted to control the timing of said pre-pulse to be dependent on the effect of the vaporization of one fuel droplet on a subsequent fuel droplet in said stream.

13. A radiation source as claimed in claim 12, wherein said pre-pulse serves to precondition a fuel droplet prior to said droplet being vaporized and wherein said controller controls the timing of said pre-pulse to optimize the preconditioning of said fuel droplet.

14. A radiation source as claimed in claim 13, wherein said pre-pulse shapes said fuel droplet, and wherein said controller controls the timing of said pre-pulse based on oscillations in the shape of said fuel droplet caused by the vaporization of a preceding fuel droplet.

15. A radiation source as claimed in claim 14, wherein the controller controls the timing of the pre-pulse to be coincident with a point in the oscillation of the fuel droplet where the fuel droplet has its original shape.

16. A radiation source as claimed in claim 9, wherein a subsequent fuel droplet is caused to oscillate in shape by the vaporization of a preceding fuel droplet and the controller controls the timing of the laser pulse to coincide with an optimum shape of said subsequent fuel droplet.

17. A lithographic apparatus comprising a radiation source for generating EUV radiation, said radiation source comprising:
    means for supplying a stream of fuel droplets to a target area;
    a laser configured to emit pulses of laser radiation to said target area to vaporize a fuel droplet to generate EUV radiation; and
    control means for predicting a delay caused by the effect of vaporization of one fuel droplet on a subsequent fuel droplet in said stream, and controlling the laser to be dependent on the predicted delay caused by the effects of the vaporization of one fuel droplet on a subsequent fuel droplet in said stream.

18. A radiation source for generating EUV radiation, the radiation source comprising:
    a fuel supply configured to supply a stream of fuel droplets to a target area;
    a laser configured to emit pulses of laser radiation to said target area to vaporize a fuel droplet to generate EUV radiation; and
    a controller configured to predict a delay caused by the effect of vaporization of one fuel droplet on a subsequent fuel droplet in said stream, and to control the laser to be dependent on the predicted delay caused by the effects of the vaporization of one fuel droplet on a subsequent fuel droplet in said stream.

* * * * *